(12) United States Patent
Jeon et al.

(10) Patent No.: US 6,222,412 B1
(45) Date of Patent: *Apr. 24, 2001

(54) CIRCUIT FOR CONTROLLING WAVEFORM DISTORTION AT A CONTROL TERMINAL OF A RADIO FREQUENCY TRANSISTOR

(75) Inventors: Kye-Ik Jeon; Jae-Myoung Baek; Dong-Wook Kim; Song-Cheol Hong, all of Taejon (KR)

(73) Assignee: Korea Advanced Institute of Science and Technology (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/960,640

(22) Filed: Oct. 30, 1997

(30) Foreign Application Priority Data

Oct. 30, 1996 (KR) .................................................. 96-49982

(51) Int. Cl.[7] ........................................................ H03L 5/00
(52) U.S. Cl. ........................... 327/320; 327/314; 327/325
(58) Field of Search ................................... 327/309, 314, 327/318, 320, 325, 326, 586

(56) References Cited

U.S. PATENT DOCUMENTS

| | | | |
|---|---|---|---|
| 4,551,643 | * 11/1985 | Russell et al. | 327/428 |
| 4,553,082 | * 11/1985 | Nesler | 323/288 |
| 4,703,286 | * 10/1987 | Muterspaugh | 331/117 FE |
| 4,847,520 | * 7/1989 | O'Neill et al. | 323/289 |
| 5,041,766 | * 8/1991 | Fiene et al. | 315/219 |
| 5,061,903 | * 10/1991 | Vasile | 330/311 |
| 5,138,285 | * 8/1992 | Michels | 331/116 FE |
| 5,262,699 | * 11/1993 | Sun et al. | 315/209 R |
| 5,376,841 | * 12/1994 | Itakura et al. | 327/94 |
| 5,426,334 | * 6/1995 | Skovmand | 327/427 |
| 5,500,721 | * 3/1996 | Randall et al. | 355/265 |
| 5,514,935 | * 5/1996 | Oda et al. | 315/82 |
| 5,615,094 | * 3/1997 | Cosentino et al. | 363/56 |

(List continued on next page.)

OTHER PUBLICATIONS

K. Yamauchi et al., A Microwave Miniaturized Linearizer Using A Parallel Diode, IEEE MTT–S Digest, 1119–1202 (1997).

K.–I. Jeon et al., Input Harmonics Control Using Non–Linear Capacitor in GaAs FET Power amplifier., IEEE MTT–S Digest, 817–820 (1997).

(List continued on next page.)

Primary Examiner—Kenneth B. Wells
(74) Attorney, Agent, or Firm—Knobbe, Martens, Olson & Bear, LLP

(57) ABSTRACT

The present invention relates to a circuit for controlling waveform distortion resulting from nonlinearity of the impedance of a control terminal (gate or base) capacitance of a transistor, which can be employed in circuits showing a nonlinearity performance of high frequency amplifier or oscillator. According to the circuit of the invention, the waveform distortion can be properly controlled to improve the efficiency of power conversion in a high frequency circuit employing FET, regardless of the frequency band, while assuring a favorable matching of input for the circuit. Also, it can provide the reliability of an integrated circuit by employing outside voltage control circuit. Moreover, it can be fabricated on a wafer substrate of FET circuit with an inexpensive cost, which affords unrestricted designing of the circuit.

38 Claims, 5 Drawing Sheets

U.S. PATENT DOCUMENTS

| | | | |
|---|---|---|---|
| 5,642,251 | * | 6/1997 | Lebbolo ................................ 361/84 |
| 5,705,898 | * | 1/1998 | Yamashita et al. .................. 315/308 |
| 5,798,666 | * | 8/1998 | Tihanyi ................................ 327/377 |
| 5,808,332 | * | 9/1998 | Kohno et al. ........................ 257/280 |

OTHER PUBLICATIONS

P.M. White and T.M. O'Leary, A 50% Efficiency 8W C–Band PHEMT Power MMIC Amplifier, IEEE GaAs IC Symp., 277–280 (1995).

K. Yamauchi et al., A Novel Series Diode Linearizer for Mobile Radio Power Amplifiers, IEEE MTT–S Digest, 831–834 (1996).

M. Maeda et al., A High Power and High Efficiency Amplifier with Controlled second–harmonic Source Impedance, IEEE MTT–S Digest, 579–582 (1995).

* cited by examiner

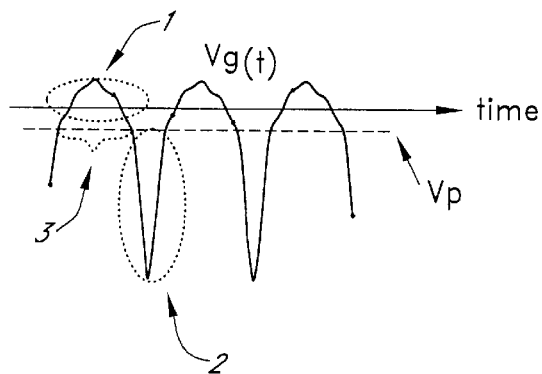
FIG. 3
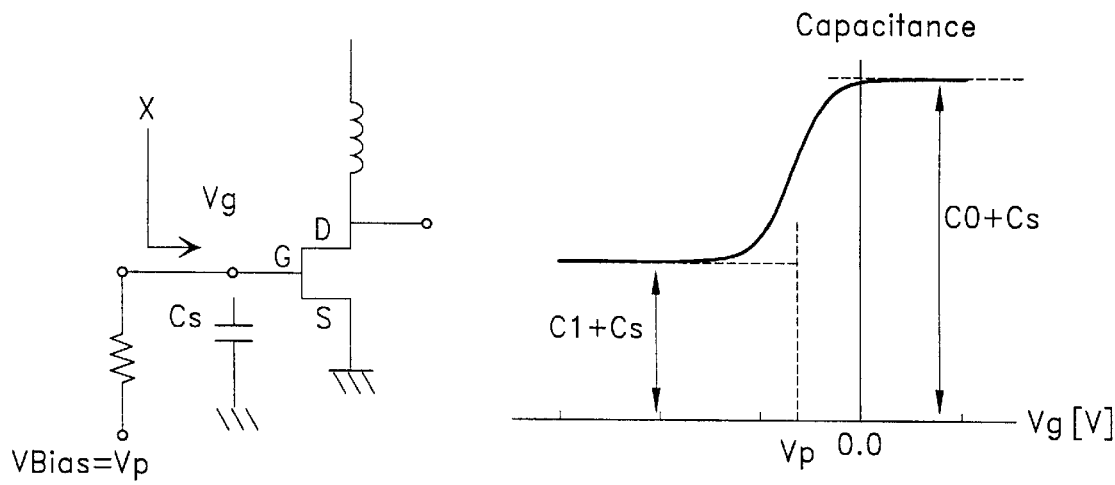
FIG. 4A     FIG. 4B
*PRIOR ART*

CIRCUIT FOR CONTROLLING WAVEFORM DISTORTION AT A CONTROL TERMINAL OF A RADIO FREQUENCY TRANSISTOR

FIELD OF THE INVENTION

The present invention relates to a circuit for controlling waveform distortion at a control terminal of high frequency transistor, more specifically, to a circuit for controlling waveform distortion resulting from nonlinearity of the impedance of a control terminal (gate or base) capacitance of a transistor, which can be employed in circuits showing a nonlinearity performance of high frequency amplifier or oscillator.

BACKGROUND OF THE INVENTION

In general, gate capacitance means a capacitance applied between channel area and gate of FET(field effect transistor). Referring to FIG. 1, a typical gate capacitance characteristic of FET is depicted. As can be seen in FIG. 1, the gate capacitance has a value of C0 above threshold voltage(Vt), and at a range of below Vp(≈Vt), it has a remained parasitic capacitance(C1) of about 1/10 of C0 value, which is caused by the rapid reduction of the capacitance while free carrier disappeared at the channel area.

The effects of the gate capacitance characteristics on a circuit is described in more detail with references on the accompanying drawings, which show a circuit of a high frequency power amplifier employing FET (see: FIG. 2) and a pattern of signal waveform distortion at the gate terminal of the power amplifier(see: FIG. 3).

The circuit depicted in FIG. 2 may be operated in a class of B, AB or F, where gate bias voltage is set around Vp as shown in FIG. 1. Referring to FIG. 2, the sine wave signal(Vin) is inputted to an input matching part of the power amplifier, while a distorted waveform such as Vg(t) occurs at the gate terminal of FET. This distorted waveform is shown more specifically in FIG. 3, where the gate signal waveform Vg(t) is a combined one of the gate bias voltage (Vp) and the gate input signal.

Referring to FIG. 3, time course of the gate signal waveform Vg(t) is shown, where Vg(t) rapidly changes to a spike at a voltage range(2) lower than Vp, while it changes slowly at a voltage range(1) higher than Vp. If the Vp biased sine wave are applied to the gate terminal (G) without any distortion, the voltage above Vp will be applied to the gate terminal for a period equivalent to 180° within one cycle of the sine wave. However, the waveform distortion shown in FIG. 3 does not coincide with the expectation, where the voltage above Vp is applied to the gate terminal longer than the expectation. This phenomenon is caused by the change of capacitance of the impedance of the gate terminal depending on the voltage(see: FIG. 1), while the impedance of the input matching part, due to the linearity, remains constant regardless of the magnitude of the signal(see: FIG. 2).

The degree of waveform distortion is directly related with the ratio of C0 and C1(see: FIG. 1): The larger the ratio is, the severer the distortion becomes, and a non-distorted waveform which is close to the sine wave is provided, when the ratio is near 1. In addition, when the sine wave without any distortion is inputted to the gate of FET, FET is turned on for a period equivalent to 180° of one cycle. However, since the distorted waveform is actually applied to the gate as shown in FIG. 3, FET is turned on more longer than the period equivalent to 180°.

Due to the reason illustrated as aboves, the drain(D) current becomes overflowed, which results in the drop of the overall efficiency of the amplifier(see: Paul M. White, IEEE MTTs, pp.277–230(1994); Masahiro Maeda, IEEE MTTs, pp.579–582(1995); Kyeik Jeon, IEEE MTTs, pp.817–820 (1997)).

According to the simulation studies, the amplifier whose gate is operated in a distorted waveform as in FIG. 3, requires more D.C. electric power more than that operated by the sine wave by the percentage of 30%, which means the reduction of the efficiency of about 30%. Therefore, the reduction of the efficiency can be prevented by controlling or avoiding the waveform distortion. And, the distortion can be properly controlled by regulating the ratio, since the distortion depends on the nonlinearity of the gate capacitance, i.e., the ratio of the capacitances at the range of below and above Vp.

The nonlinearity of capacitance may affect on the linearity of the power amplifier, in addition to the reduction of efficiency. At the gate, the voltage swing is larger at the lower input voltage than that of at the higher input voltage. Moreover, since the capacitance is nonlinear, the impedance of gate may be varied depending on the inputted voltage, which causes the occurrence of so-called "phase distortion", by which the phase of output according to the input of the amplifier changes depending on the electric power. Therefore, if the capacitance of gate remains constant without the dependence of the gate voltage, the gate impedance will have a constant value regardless of the applied voltage, which results in the reduction of the phase distortion.

In this connection, a method for controlling the distortion of the sine wave by regulating the ratio of the gate capacitance in a range of above and below Vp viewed from the X side of FIG. 2 to have a value of approximately 1, has been suggested in the art. This method was realized by employing a shunt capacitor(Cs) between the gate terminal and source terminal of FET as in FIG. 4(A) (see: Paul M. White, IEEE MTTs, pp.277–280(1994)). This circuit, as can be seen in FIG. 4(B), has its merits of relaxing the nonlinearity of the gate capacitance by increasing the capacitance at the input terminal of FET to the level of Cs. However, the prior art circuit is proven to be less satisfactory in the sense that matching of impedance of the amplifier input terminal is very difficult, due to the increase of admittance of the input terminal of the FET by the increased amount of the gate capacitance.

Under the circumstance, a method which employs a circuit supplemented with a LC series circuit between source terminal and gate terminal of FET has been suggested. This circuit, grounded on a fact that the waveform distortion shown in FIG. 3 is resulted from the second high frequency which is caused mainly by the nonlinearity of the gate capacitance, controls the waveforms distortion by locating a LC series circuit which has a characteristic of resonating at the second harmonic frequency, between the source terminal and the gate terminal and then by controlling the component of the second harmonic frequency. However, this method also have revealed shortcomings such that: it can be applied only in the circuit with narrow frequency band, because the inductance and capacitance should be changed according to the signal frequency applied to FET.

Accordingly, there are strong reasons for exploring and developing alternative means for controlling waveform distortion at a gate terminal of FET, while overcoming the problem that their operating frequency are rather limited and matching of the input impedance is difficult, due to the use of linear device such as capacitor.

SUMMARY OF THE INVENTION

In this regard, the present invention developed a circuit for controlling waveform distortion at a control terminal of high frequency transistor by substituting nonlinear device such as diode for linear device such as capacitor which has been used for controlling the decrease of the efficiency resulting from the nonlinearity of gate capacitance of high frequency FET circuit. The circuit for controlling waveform distortion affords easy matching of input impedance regardless of the frequency of the circuit and, can control the nonlinearity of the gate capacitance, especially, it can control the gate capacitance on the outside of an integrated circuit.

A primary object of the present invention is, therefore, to provide a circuit for controlling waveform distortion at a terminal of high frequency transistor, by employing nonlinear device in order to improve the linearity and efficiency of the electric power conversion of the high frequency circuit.

BRIEF DESCRIPTION OF DRAWINGS

The above and the other objects and features of the present invention will become apparent from the following description given in conjunction with the accompanying drawings, in which:

FIG. 3 is a graph showing a waveform distortion at the transistor gate terminal of the power amplifier of FIG. 2.

FIG. 4(A) is a schematic diagram showing a circuit for controlling the waveform distortion of the prior art, where a parallel capacitor is installed at the transistor gate terminal.

FIG. 4(B) is a graph showing the decrease of the nonlinearity which is a characteristic of the gate capacitance by employing the circuit of FIG. 4(A).

DETAILED DESCRIPTION OF THE INVENTION

Figure 1:
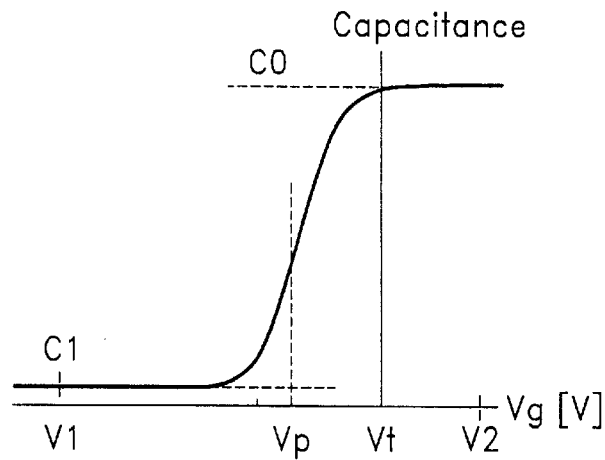
FIG. 1 is a graph showing a typical gate capacitance characteristic depending on the gate voltage of a field effect transistor (FET).
Figure 2:
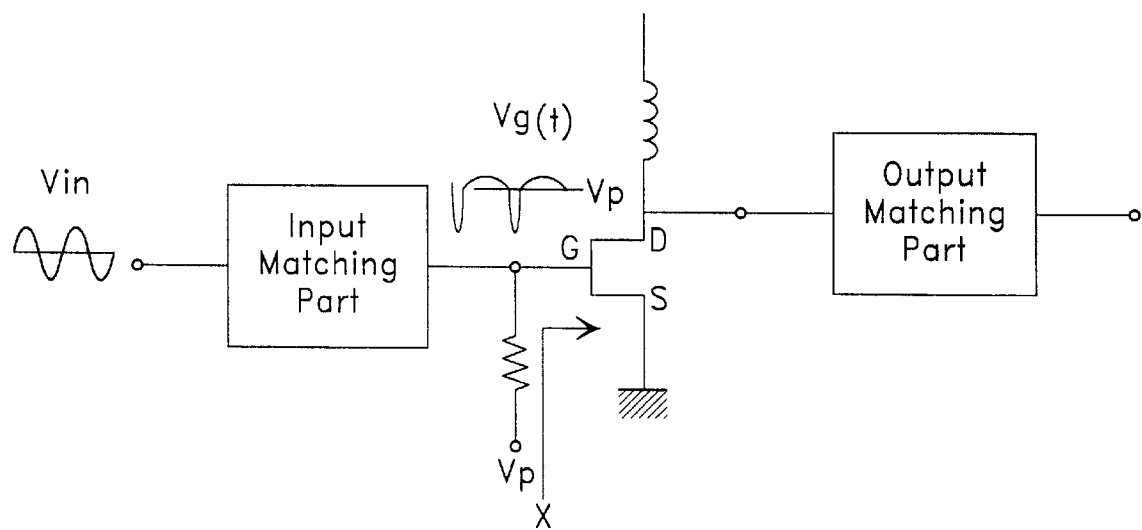
FIG. 2 is a schematic diagram showing a circuit of a high frequency power amplifier employing FET.
Figure 5:
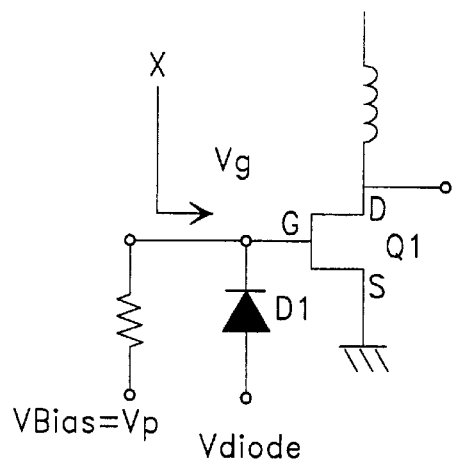
FIG. 5 is a schematic diagram depicting a circuit for controlling waveform distortion employing a diode, which is one of preferred embodiments of the present invention.
Figure 6:
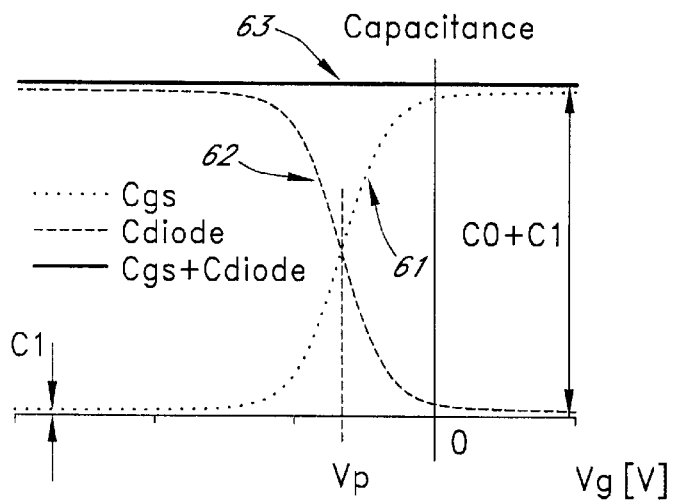
FIG. 6 is a graph showing a typical gate capacitance characteristic where nonlinearity is controlled by employing the circuit of FIG. 5.
Figure 7:
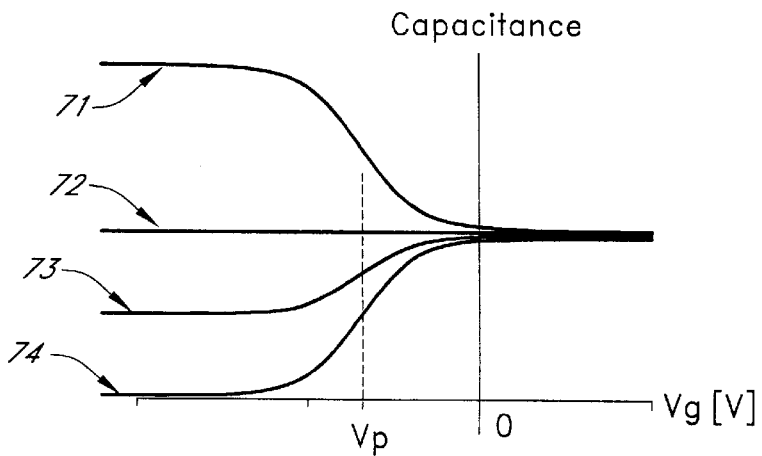
FIG. 7 is a graph showing the change of the typical gate capacitance characteristic depending on the change of the junction area of the diode employed in the circuit of FIG. 5.

FIG. 5 is a schematic diagram depicting a circuit for controlling waveform distortion employing a diode, which is one of preferred embodiments of the present invention. FIG. 6 is a graph showing a typical gate capacitance characteristic where nonlinearity is controlled by employing the circuit of FIG. 5. FIG. 7 is a graph showing the change of the typical gate capacitance characteristic depending on the change of the junction area of the diode employed in the circuit of FIG. 5.

Referring to FIG. 5, cathode of a diode(D1) is connected to a gate terminal of FET, where the diode may be connected to a circuit consisted of discrete FET by employing PCB or may be fabricated in a form of connecting a source electrode and a drain electrode of FET. The diode can be fabricated on a wafer substrate in the course of fabricating FET integrated circuit.

Gate terminal of FET Q1 is anode of a diode fabricated by a gate-source junction, while cathode of the diode(D1) is connected to the gate terminal of Q1. Therefore, when the anode voltage of D1(Vdiode) is 2·Vp(i.e., 2 times of the gate bias voltage), the gate capacitance of Q1 is represented as a solid line(63) of FIG. 6. Referring to FIG. 6, a curve 61 represents a capacitance of the gate-source junction, while the other curve 62 represents a capacitance of the diode, and the sum of curve 61 and 62 makes a curve 63. The curve 63 has a constant value of about C0+C1 in the range of above and below the threshold voltage(Vp). While the overall gate capacitance is increased in the range of above and below Vp by the capacitors(Cs) in parallel, this circuit increases the capacitance only below Vp and does not increase the capacitance above Vp. As a result, this circuit controls waveform distortion, and, unlike the prior circuits employing the capacitors connected in parallel, match of the input can be easily realized in this circuit.

Also, as shown in FIG. 7 which depicts the adjustment of the junction area of a diode, the degree of waveform distortion can be controlled by regulating the turn-on time of transistor within one cycle on the operation of signal. This is due to the change of the capacitance below Vp depending on the area when the junction area of diode is changed. In FIG. 7, curve 71 represents a gate capacitance when anode area of D1 is 2 times larger than gate area of Q1, and curves 72, 73 and 74 are gate capacitances when anode area of D1 is 1 time, 0.5 time and 0 time of gate area of Q1, respectively. By changing the junction area of a diode, the curves 71, 72, 73 and 74 can adjust the turn-on time below 180°, 180° and above 180°, respectively. Such an adjustment of turn-on time may be utilized for the optimization of capability in the course of designing of a circuit(see: Sachihiro Toyoda, IEEE MTTs Digest, pp.277–280(1993)).

Figure 8B:
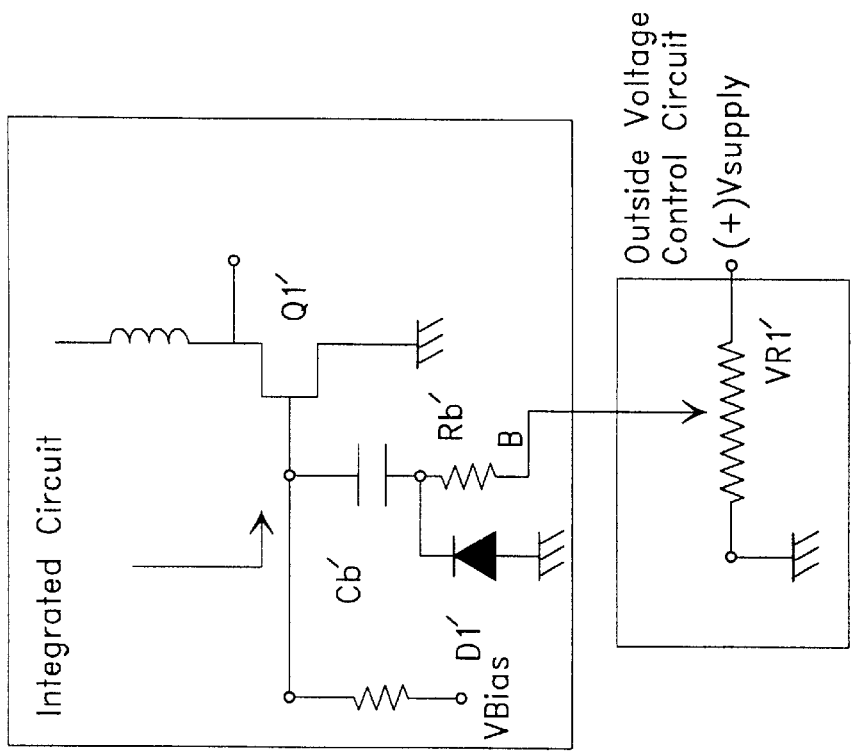
FIGS. 8(A) and 8(B) are the other embodiment of a circuit which controls the gate capacitance of a transistor on the outside of an integrated circuit.
Figure 8A:
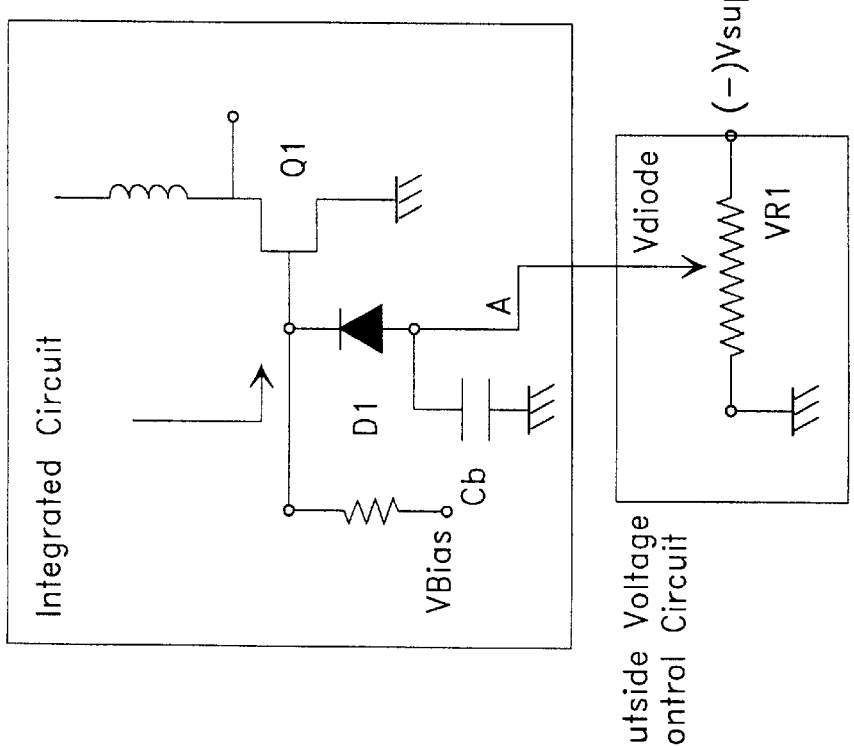

The other embodiment of the present invention includes a circuit which is capable of changing the gate capacitance of an input terminal of FET by changing an anode voltage of a diode(Vdiode). FIGS. 8(A) and 8(B) depict the circuits for controlling the gate capacitance of an IC transistor on the outside of an integrated circuit.

Referring to FIGS. 8(A), the circuit comprises: a circuit for allotting voltage(outside voltage control circuit) employing a variable resistor(VR1) connected to anode of a diode on the outside of an integrated circuit; and, a capacitor(Cb) is connected to the anode of diode(D1). Referring to FIG. 8(B), unlike the circuit of FIG. 8(A), cathode of a diode (D1') is connected to a gate terminal of FET(Q1') through a capacitor(Cb'), while anode of diode(D1') is connected to a circuit for allotting voltage through a blocking resistor(Rb').

The circuit shown in FIG. 8(A) uses a negative voltage power, while the circuit of FIG. 8(B) uses a positive voltage power. The variable resistors(VR1, VR1') employed in the circuits for allotting voltage in FIGS. 8(A) and 8(B) play a role of changing the capacitance of each diode by adjusting the voltage of each power supply(Vsupply) and applying it to anode of diode(D1) and cathode of diode(D1'), respectively. The larger the capacitance of capacitors(Cb1, Cb1'), the better it is, and operation is not affected, if the capacitance is 4 or 5 times larger than the maximized capacitance of diodes(D1, D1'). On the other hand, the blocking resistor (Rb') shown in FIG. 8(B) plays a role of blocking alternating current(AC) component on line B, whose resistance is preferably fixed as numbers of kohm. As explained above, since there exists only direct current(DC) component at lines A and B, the capacitance of the gate terminal can be regulated by installing the variable resistors(VR1, VR1') on the outside of the high frequency circuit(integrated circuit), so that the circuit of interest can have a proper capability.

Figure 9:
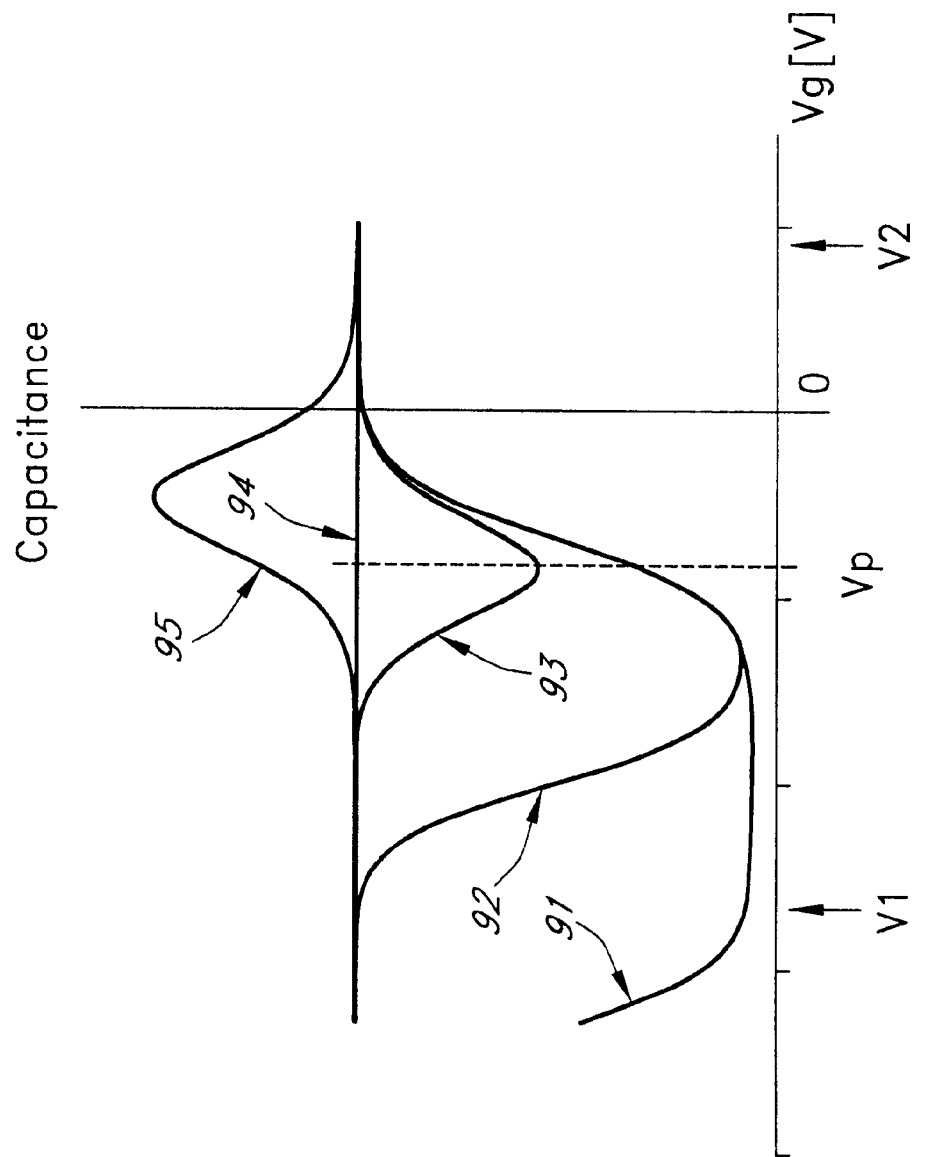
FIG. 9 is a graph showing the change of the gate capacitance characteristic depending on the voltage of a diode in the circuit of FIG. 8(A).

FIG. 9 is a graph showing the change of the characteristic gate capacitance depending on Vdiode of the circuit of FIG. 8(A), where the ratio of junction area of diode and FET gate is set to be 1:1. As previously described, the gate capacitance has the following characteristics depending on the value of Vdiode: when Vdiode is 2 Vp, it has a characteristic of curve 94; when Vdiode is below 2 Vp(around 4 Vp), it has a characteristic of curve 91; when Vdiode is between 2 Vp and 4 Vp(around 3 Vp), it has a characteristic of curves 92 and 93; and, when Vdiode is above 2 Vp, it has a characteristic of curve 95.

For the reasons provided in the foregoing, the waveform distortion swinging between V1 and V2 can be properly controlled, since the capacitance below Vp can be regulated depending on the voltage(see: FIG. 9). The circuit of FIG. 8(B) ("the circuit 8(B)") can be understood similarly as in the circuit of FIG. 8(A) ("the circuit 8(A)"). For example, the circuit 8(B) is operated in an analogous manner as in the circuit 8(A) in which Vdiode is 2 Vp, provided that Vdiode of the circuit 8(B) is −Vp and gate bias voltage(Vbias) is Vp(generally, negative voltage).

As clearly illustrated and demonstrated as above, the present invention provides a circuit for controlling waveform distortion at a control terminal of high frequency transistor. According to the circuit of the invention, the waveform distortion can be properly controlled to improve the efficiency of power conversion in a high frequency circuit employing FET, regardless of the frequency band, while assuring a favorable matching of input for the circuit. Also, it can provide the reliability of an integrated circuit by employing outside voltage control circuit. Moreover, it can be fabricated on a wafer substrate of FET circuit with an inexpensive cost, which affords unrestricted designing of the circuit.

Although the preferred embodiment of the present invention have been disclosed for illustrative purpose, those who are skilled in the art will appreciate that various modifications, additions and substitutions are possible, without departing from the scope and spirit of the invention as disclosed in the accompanying claims. In particular, though the present invention is described in view of MESFET and HEMT, it can be applied to transistors including BJT and HBT.

What is claimed is:

1. A circuit for controlling waveform distortion at a control terminal of a transistor which receives a radio frequency signal, the circuit comprising:
    a diode comprising a cathode and an anode, the cathode being connected to a control terminal of the transistor receiving a radio frequency signal and the anode being provided with a non-zero fixed voltage during operation of the circuit;
    a voltage dividing circuit, connected to the anode of the diode, for varying a capacitance of the diode, and
    a capacitor whose one terminal is connected to the anode of the diode and the other terminal is grounded.

2. A circuit for controlling waveform distortion at a control terminal of a transistor which receives a radio frequency signal, the circuit comprising:
    a capacitor whose one terminal is connected to the control terminal of the transistor,
    a diode comprising a cathode and an anode, the cathode being connected to another terminal of the capacitor and the anode being grounded during the operation of the circuit,
    a resistor whose one terminal is connected to the cathode of the diode, and
    an adjustable voltage supply connected to another terminal of the resistor.

3. A waveform control circuit comprising:
    a transistor receiving a radio frequency signal at a control terminal during operation;
    a first voltage supply providing a bias voltage to the control terminal of the transistor;
    a nonlinear device having a first terminal and a second terminal, the nonlinear device having a nonlinear capacitance which varies in relation to an applied voltage between the first and second terminals thereof, the first terminal being connected to the control terminal of the transistor, the second terminal being provided with a fixed voltage during operation of the circuit; and
    an adjustable second voltage supply connected to either the first or the second terminal of the nonlinear device.

4. The waveform control circuit as defined in claim 3, wherein the transistor comprises one selected from the group consisting of BJT, FET, MESFET, HEMT, and HBT.

5. The waveform control circuit as defined in claim 3, wherein the nonlinear device is a diode, the first terminal is a cathode of the diode and the second terminal is an anode of the diode.

6. The waveform control circuit as defined in claim 3, wherein the nonlinear device is connected to the control terminal of the transistor via a printed circuit board or an integrated circuit.

7. The waveform control circuit as defined in claim 3, further comprising:
    an AC bypass circuit connected to the second terminal of the nonlinear device, the AC bypass circuit bypassing an alternating current component of the signal passing through the device from the control terminal of the transistor; and
    wherein the adjustable second voltage supply is connected to the second terminal of the nonlinear device and provides the fixed voltage to the second terminal of the device during the operation of the circuit.

8. The waveform control circuit as defined in claim 7, wherein the adjustable second voltage supply comprises a voltage dividing circuit.

9. The waveform control circuit as defined in claim 7, wherein the nonlinear device is fabricated within a package of an integrated circuit incorporating the transistor whereas the adjustable second voltage supply is located outside of the package.

10. The waveform control circuit as defined in claim 7, wherein the AC bypass circuit comprises a capacitor.

11. The waveform control circuit as defined in claim 10, wherein the capacitor has a capacitance greater than four times the maximum capacitance of the nonlinear device.

12. The waveform control circuit as defined in claim 3, wherein the second terminal of the nonlinear device is grounded, the waveform control circuit further comprising:
    a DC blocking circuit interveningly connecting the first terminal of the nonlinear device and the control terminal of the transistor, the DC blocking circuit preventing a direct current component of the signal from being applied to the first terminal of the nonlinear device; and
    wherein the adjustable second voltage supply is connected to the first terminal of the nonlinear device, the second voltage supply provides a constant voltage to the first terminal of the device during the operation of the circuit.

13. The waveform control circuit as defined in claim 12, wherein the adjustable second voltage supply comprises a voltage dividing circuit.

14. The waveform control circuit as defined in claim 13, wherein an AC blocking circuit interveningly connects the voltage dividing circuit and the first terminal of the device to block an alternating current component of the signal flowing through to the voltage dividing circuit.

15. The waveform control circuit as defined in claim 14, wherein the AC blocking circuit comprises a resistor.

16. The waveform control circuit as defined in claim 12, wherein the nonlinear device is fabricated within a package of an integrated circuit incorporating the transistor whereas the adjustable second voltage supply is located outside of the package.

17. The waveform control circuit as defined in claim 12, wherein the DC blocking circuit comprises a capacitor.

18. The waveform control circuit as defined in claim 17, wherein the capacitor has a capacitance greater than four times the maximum capacitance of the nonlinear device.

19. A method of controlling waveform at a control terminal of a transistor receiving a radio frequency signal, the method comprising:
   providing a first voltage supply applying a bias voltage to the control terminal of the transistor;
   providing a nonlinear device having a first terminal and a second terminal, the nonlinear device having a nonlinear capacitance which varies in relation to an applied voltage, the first terminal being connected to the control terminal of the transistor;
   providing a second voltage supply connected to either the first or the second terminal of the nonlinear device; and
   adjusting the capacitance of the nonlinear device, wherein the second terminal is provided with a fixed voltage while the transistor receives a radio frequency signal.

20. The method as defined in claim 19, wherein the adjusting the capacitance of the nonlinear device comprises adjusting the second voltage supply.

21. The method as defined in claim 19, wherein the nonlinear circuit device is a diode, the first terminal is a cathode of the diode and the second terminal is an anode of the diode.

22. The method as defined in claim 21, wherein the diode is formed either in a discrete circuit element or as a part of an integrated circuit.

23. The method as defined in claim 21, wherein the adjusting the capacitance of the diode comprises adjusting a junction area of the diode.

24. The method as defined in claim 19, wherein the transistor comprises a bipolar junction transistor (BJT) or a field effect transistor (FET).

25. The method as defined in claim 20, further comprising:
   providing an AC bypass circuit connected to the second terminal of the nonlinear device, the AC bypass circuit bypassing an alternating current component of the signal passing through the device from the control terminal of the transistor; and
   wherein the second voltage supply is connected to the second terminal of the nonlinear device and provides the fixed voltage to the second terminal of the device.

26. The method as defined in claim 25, wherein the second voltage supply adjusts the fixed voltage applied to the second terminal of the nonlinear device.

27. The method as defined in claim 26, wherein the second voltage supply comprises a voltage dividing circuit.

28. The method as defined in claim 25, wherein the nonlinear device is fabricated within a package of an integrated circuit incorporating the transistor whereas the second voltage supply is provided outside the package.

29. The method as defined in claim 25, wherein the AC bypass circuit comprises a capacitor.

30. The method as defined in claim 29, wherein the capacitor has a capacitance greater than four times of a maximum capacitance of the nonlinear device.

31. The method as defined in claim 19, the method further comprising:
   providing a DC blocking circuit interveningly connecting the first terminal of the nonlinear device and the control terminal of the transistor, the DC blocking circuit preventing a direct current component of the signal from being applied to the first terminal of the nonlinear circuit device; and
   wherein the second terminal of the nonlinear device is grounded, and the second voltage supply is connected to the first terminal of the nonlinear device, the second voltage supply applying a constant voltage to the first terminal of the device.

32. The method as defined in claim 31, wherein the second voltage supply adjusts the constant voltage applied to the first terminal of the nonlinear device to control the nonlinear capacitance thereof.

33. The method as defined in claim 32, wherein the second voltage supply comprises a voltage dividing circuit.

34. The method as defined in claim 33, further comprising:
   providing an AC blocking circuit interveningly connects the voltage dividing circuit and the first terminal of the device to block an alternating current component of the signal flowing through to the voltage dividing circuit.

35. The method as defined in claim 34, wherein the AC blocking circuit comprises a resistor.

36. The method as defined in claim 31, wherein the nonlinear device is fabricated within a package of an integrated circuit incorporating the transistor whereas the second voltage supply is located outside of the package.

37. The method as defined in claim 31, wherein the DC blocking circuit comprises a capacitor.

38. The method as defined in claim 37, wherein the capacitor has a capacitance greater than four times the maximum capacitance of the nonlinear device.

* * * * *